US010510694B2

(12) United States Patent
Benson et al.

(10) Patent No.: US 10,510,694 B2
(45) Date of Patent: Dec. 17, 2019

(54) RADIO FREQUENCY COMMUNICATION SYSTEMS

(71) Applicant: ANALOG DEVICES, INC., Norwood, MA (US)

(72) Inventors: Keith E. Benson, Hopkinton, MA (US); Michael Patrick Clark, Lunenburg, MA (US); Michael Baldwin Heiny, Colorado Springs, CO (US); Vincent Lixiang Bu, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/969,483

(22) Filed: May 2, 2018

(65) Prior Publication Data
US 2019/0326234 A1    Oct. 24, 2019

Related U.S. Application Data

(60) Provisional application No. 62/659,590, filed on Apr. 18, 2018.

(51) Int. Cl.
*H01L 23/13* (2006.01)
*H01L 23/66* (2006.01)
(Continued)

(52) U.S. Cl.
CPC .......... *H01L 23/66* (2013.01); *H01L 23/053* (2013.01); *H01L 23/13* (2013.01); *H01L 23/24* (2013.01);
(Continued)

(58) Field of Classification Search
CPC ....... H01L 23/05; H01L 23/053; H01L 23/13; H01L 23/24; H01L 23/48; H01L 23/481; H01L 23/36; H01L 23/367; H01L 23/66
(Continued)

(56) References Cited

U.S. PATENT DOCUMENTS

| 6,879,488 B2* | 4/2005 | Takeda ................. H01L 23/345 174/252 |
| 7,508,267 B1 | 3/2009 | Yu et al. |

(Continued)

FOREIGN PATENT DOCUMENTS

| CN | 102611393 | 12/2014 |
| CN | 106374855 | 2/2017 |

(Continued)

OTHER PUBLICATIONS

Analog Devices Data Sheet, 0.3 GHz to 6 GHz, 35 W, GaN Power Amplifier (2017-2018).
(Continued)

*Primary Examiner* — Monica D Harrison
(74) *Attorney, Agent, or Firm* — Knobbe, Martens, Olson & Bear, LLP

(57) ABSTRACT

A packaged radio frequency (RF) module is disclosed. The module can include a substrate, a first die electrically and mechanically attached to the substrate, a second die electrically and mechanically attached to the substrate, an encapsulating material, and a lid attached to the substrate. The first die comprises a silicon-based die, such as an RF switch die, and the second die comprises a compound semiconductor die, such as an RF amplifier. The encapsulating material can protect electrical connections between the first die and the substrate. The substrate and the lid at least partially define an air cavity within which the first and the second die are mounted. An active surface of the second die is exposed to the air cavity.

21 Claims, 8 Drawing Sheets

(51) Int. Cl.
*H01L 23/053* (2006.01)
*H01L 23/24* (2006.01)
*H01L 23/367* (2006.01)
*H01L 23/48* (2006.01)
*H03F 3/195* (2006.01)
*H03F 3/24* (2006.01)

(52) U.S. Cl.
CPC .......... *H01L 23/367* (2013.01); *H01L 23/481* (2013.01); *H03F 3/195* (2013.01); *H03F 3/245* (2013.01); *H01L 2223/6611* (2013.01); *H01L 2223/6616* (2013.01); *H01L 2223/6627* (2013.01); *H01L 2223/6644* (2013.01); *H01L 2223/6683* (2013.01); *H03F 2200/451* (2013.01)

(58) Field of Classification Search
USPC ......................................................... 257/428
See application file for complete search history.

(56) References Cited

U.S. PATENT DOCUMENTS

| | | | |
|---|---|---|---|
| 7,557,421 B1 | 7/2009 | Shealy et al. | |
| 8,665,022 B2 | 3/2014 | Kobayashi | |
| 9,515,645 B2 | 12/2016 | Bakalski et al. | |
| 9,537,605 B1 | 1/2017 | Actis et al. | |
| 9,608,577 B2 | 3/2017 | Mostov et al. | |
| 9,742,445 B1 | 8/2017 | Actis et al. | |
| 9,806,678 B2 | 10/2017 | Diduck | |
| 9,960,145 B2 * | 5/2018 | Costa | H01L 23/3135 |
| 2012/0194276 A1 | 2/2012 | Fisher | |
| 2012/0092074 A1 | 4/2012 | Yanduru et al. | |
| 2015/0194942 A1 | 7/2015 | Anderson et al. | |
| 2017/0026071 A1 | 1/2017 | Young | |
| 2017/0317741 A1 | 11/2017 | Tiwari | |
| 2017/0324388 A1 | 11/2017 | Soliman | |

FOREIGN PATENT DOCUMENTS

| | | |
|---|---|---|
| WO | WO 2012/097085 | 7/2012 |
| WO | WO 2017/062195 | 4/2017 |
| WO | WO 2017/111769 | 6/2017 |

OTHER PUBLICATIONS

Campbell et al., "GaN Takes the Lead", IEEE Microwave magazine, 13(6):44-53 (Sep. 10, 2012).
Demartino, "Gallium Nitride Drives Power Amplifier Performance", Microwaves & RF (Oct. 11, 2013).
Khalil et al., "GaN HEMT Potential for Low-Noise Highly Linear RF Applications", IEEE Microwave and Wireless Components Letters, 18(9):605-607 (Oct. 2008).
Lapedus, "RF Device and Process Biz Heats Up", Semiconductor Engineering (Apr. 26, 2017).
Ross, "Gallium Nitride Phase Shifters", A thesis submitted to the Faculty of Graduate and Postdoctoral Affairs, pp. 1-147 (2015).
Rudolph et al., "Analysis of the Survivability of GaN Low-Noise Amplifiers", IEEE Transactions on Microwave Theory and Techniques, 55(1):37-43 (Jan. 2007).
Schweber, "Understanding the Basics of Low-Noise and Power Amplifiers in Wireless Designs", Digi-Key electronics (Oct. 24, 2013).

* cited by examiner

RADIO FREQUENCY COMMUNICATION SYSTEMS

BACKGROUND

Field of the Invention

The field relates to radio frequency (RF) communication systems.

Description of the Related Art

A radio frequency (RF) communication system communicates by wirelessly transmitting and/or receiving RF signals. An RF communication system can include switches used for controlling access of various components to an antenna. Furthermore, an RF communication system can include amplifiers for providing amplification to RF signals. For high performance RF communications systems, particularly ones designed for high frequency and rugged applications, such as radar for critical applications, the different components have different structures and behavior. For example, some high performance parts are provided using III-V semiconductor substrates and other exotic materials, whereas other parts are provided in silicon or silicon-on-insulator (SOI) substrates. Such components typically communicate with one another through the system board. There remains a need for improved RF communication systems.

SUMMARY

Figure 1:
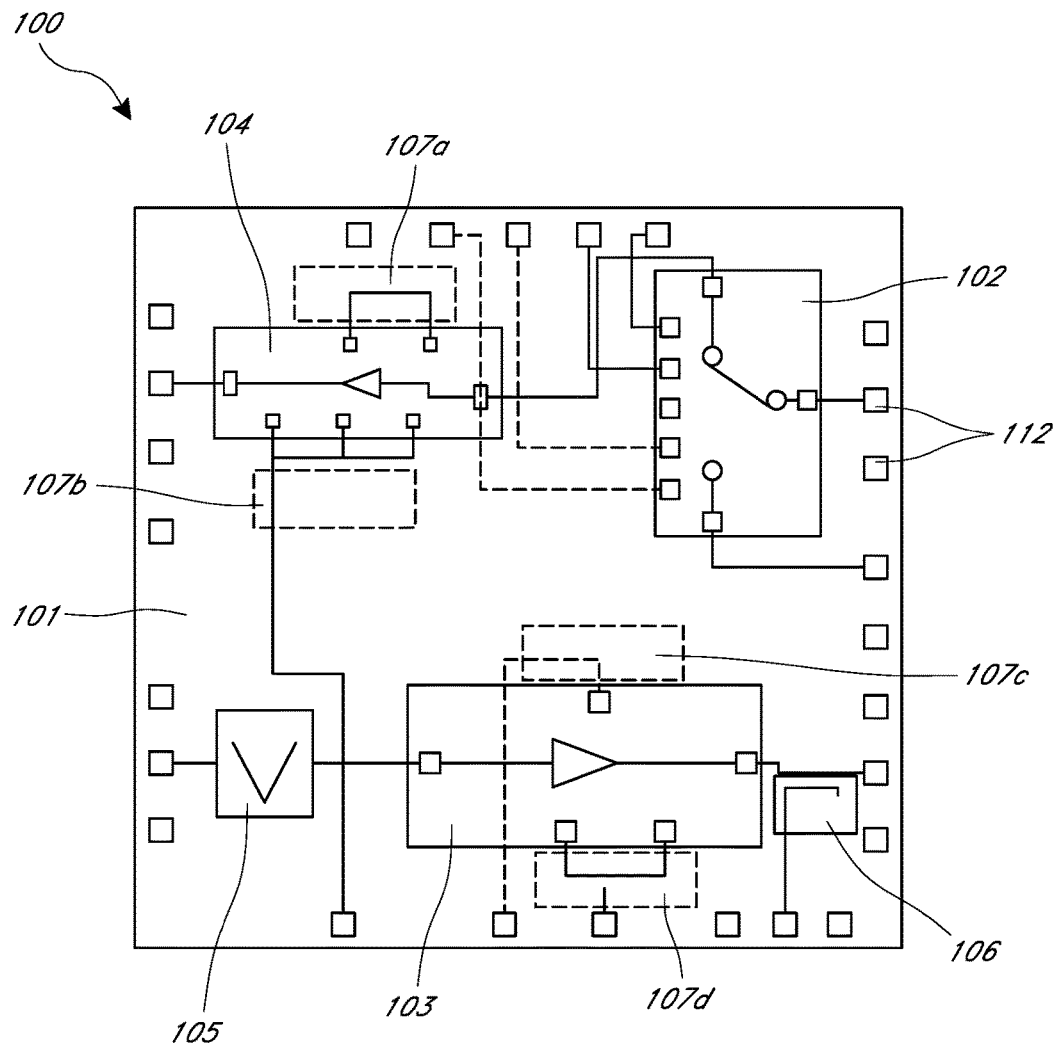
FIG. 1 is a schematic diagram of one embodiment of a packaged module for a mixed technology RF communication system that illustrates lateral locations of devices on an upper side of a package substrate and leads on a lower side of the package substrate.

In one aspect, a packaged radio frequency (RF) module is disclosed. The packaged RF module includes a package substrate, a first die, a second die, and an encapsulating material. The first die and the second die are electrically and mechanically attached to the package substrate. The first die comprises an RF switch and the second die comprises an RF amplifier. An encapsulating material protects electrical connections between the first die and the package substrate. The packaged RF module also includes a lid that is attached to the package substrate such that the package substrate and the lid at least partially define an air cavity within which the first and the second die are mounted. An active surface of the second die is exposed to the air cavity.

In one embodiment, the first die is flip-chip attached to the package substrate by way of a plurality of interconnects between the first die and the package substrate. The encapsulating material comprises underfill that is disposed at least partially between the first die and the package substrate.

In one embodiment, the packaged RF module further includes an encapsulant flow limiter on the package substrate at least partially around the first die and configured to capture encapsulating material bleeding from the first die.

In one embodiment, the second die is connected to the package substrate by RF vias. The second die comprises a bottom surface opposite the active surface and the bottom surface comprises patterned contacts for RF signal connections between the second die and the package substrate.

In one embodiment, the substrate includes one or more solder mask webs on the package substrate.

In one embodiment, the substrate includes through substrate vias extending from a top surface of the substrate to a bottom surface of the package substrate. The through substrate vias can be configured to provide thermal or ground connections with the second die.

In one embodiment, the first die is wire bonded to the package substrate and the encapsulating material comprises a gel at least over bond wire connections on the first die.

In one embodiment, the first die is packaged within the encapsulating material and mounted onto the package substrate.

In one embodiment, the packaged RF module further comprises a filter integrated with the package substrate. The filter can be integrated on a top surface of the substrate. The filter can be integrated in an internal layer of the package substrate.

In one embodiment, the packaged RF module further comprises a metal slug integrated into the package substrate beneath the second die. The metal slug is configured to transfer heat from the second die. The metal slug can be configured to transfer heat from the second die and make a ground connection.

In one embodiment, the packaged RF module further includes a third die that is attached to the package substrate and comprising a second RF amplifier. The second die can comprise a power amplifier (PA) and the third die can comprise a low noise amplifier (LNA). An active surface of the third die can be exposed to the air cavity.

In one embodiment, the first die and the third die are packaged to define an integrated circuit (IC). The IC can be attached to the package substrate by solder balls.

In one embodiment, the second die comprises a compound semiconductor substrate. The compound semiconductor substrate can comprise gallium nitride or gallium arsenide die.

In one embodiment, the first die comprises a silicon-on-insulator (SOI) die.

In another aspect, a transmit/receive (TR) module is disclosed. The TR module includes a package substrate, at least one compound semiconductor die and at least one silicon-based die. The dies are electrically and mechanically attached to the package substrate. The TR module also includes an encapsulating material that protects electrical connections between the silicon-based die and the package substrate. The TR module further includes a lid attached to the package substrate such that the package substrate and the lid at least partially define an air cavity within which the silicon-based and the compound semiconductor die are mounted. An active surface of the compound semiconductor die is exposed to the air cavity.

In one embodiment, the compound semiconductor die comprises a Group III-V semiconductor substrate. The compound semiconductor die can comprise an amplifier die. The amplifier die can comprise a power amplifier. The silicon-based die can comprise an RF switch die. The TR module can further comprise a separate carrier substrate between the silicon-based die and the package substrate in a package-in-package arrangement.

In one embodiment, the at least one silicon-based die comprises an low noise amplifier circuits and an RF switch circuit. The TR module can further comprise a separate carrier substrate between the silicon-based die and the package substrate in a package-in-package arrangement.

In another aspect, a packaged radio frequency (RF) module is disclosed. The packaged PR module includes a package substrate, a compound semiconductor die and a silicon based die. The dies are mechanically attached to the package substrate. The compound semiconductor die is electrically connected to the package substrate by way of through substrate vias (TSVs) that are configured to carry RF signals. A silicon based die is electrically and mechanically attached to the package substrate. The package PF module also includes an encapsulating material that covers electrical connections of the silicon based die.

In one embodiment, the compound semiconductor die is additionally encapsulated. The encapsulating material can cover the compound semiconductor die and the silicon based die.

In one embodiment, the compound semiconductor die comprises an active surface facing away from the package substrate and a bottom surface opposite the active surface. The bottom surface can comprise patterned contacts for RF signal connections between the TSVs and the package substrate.

DETAILED DESCRIPTION

Various embodiments disclosed herein may be particularly beneficial for high frequency systems, such as, for example, radar systems and wireless cellular communications systems (e.g., wireless systems conforming to the 5G standard). Embodiments disclosed herein may also be beneficial for packages that include multiple dies with different characteristics, e.g., dies that perform different functions, dies that have different operating parameters, etc. For example, some types of dies (e.g., amplifier dies) may benefit from packaging within an air cavity. Often such high performance dies are manufactured from compound semiconductor (e.g., Group III-IV) substrates. Other types of dies (e.g., switching dies) may benefit from isolation of packaging connections, which can be at least partially embedded in a molding compound. Switching dies for high performance applications can be manufactured from silicon or silicon-on-insulator (SOI) substrates (silicon-based substrates or dies), along with numerous other types of integrated circuit dies, including processor dies and some types of amplifier dies. Because of these different packaging preferences, typically such dies are separately packaged and communicate with one another through a system board.

An RF communication system can include various types of switches and amplifiers. One type of amplifier is a low noise amplifier (LNA), which can provide amplification to relatively weak RF signals received by the system, while introducing only a relatively small amount of noise, thereby enhancing signal-to-noise ratio (SNR) and allowing the RF communication system to receive signals from greater distances and/or from relatively weak transmitters. For transmitting signals, a power amplifier (PA) can provide amplification for signals to be sent to the antenna, which can transmit the signals to an external device or system. A transmit/receive (TR) module as described herein can include either or both of an LNA and a PA.

High performance amplifiers for high frequency and/or highly sensitive radar applications, can be manufactured (e.g., patterned or defined in an amplifier die) using gallium arsenide (GaAs), gallium nitride (GaN) or other compound semiconductor (particularly Group III-V) substrates. Compound semiconductor technologies offer good amplification characteristics and thus are suitable for fabricating RF amplifiers. In some embodiments, an LNA die can be provided with a group III-V semiconductor substrate. In some embodiments, a PA die can be provided with a group III-V semiconductor substrate. In some embodiments, at least one of the PA and LNA dies is provided with a silicon substrate and the other of the PA and LNA dies are provided with a group III-V semiconductor substrate. In some embodiments, both of the LNA and PA are formed in Group III-V substrates. An RF switch can be manufactured (e.g., patterned or defined in a switching die) using thinned silicon or silicon-on-insulator (SOI) technology.

In various embodiments disclosed herein, the packaged RF module can comprise an air cavity package, in which integrated device dies may be disposed in an air cavity defined at least in part by a package substrate and a package lid attached to the package substrate. In some embodiments, some of the dies can be at least partially embedded in an encapsulating material. The encapsulating material can protect, for example, electrical connections and/or other portions of the die that utilize the molding material. However, the encapsulating material (which may comprise a plastic such as epoxy or other insulating material) may degrade the performance of group III-V dies (e.g., one or more high frequency amplifiers), which display superior performance when their active surfaces are exposed to air. For example, the encapsulating material can add capacitance, reduce gain, reduce power, etc. Accordingly, it can be beneficial to provide the amplifier die(s) (e.g., the LNA and/or PA dies) in an air cavity without the encapsulating material on its active surface in order to maintain high performance for the RF system.

However, unlike for group III-V semiconductor dies, it may be beneficial to protect the electrical connections of silicon-based die(s) (e.g., a switching die) in an encapsulating material (e.g., overmold encapsulant, gel over wire bonds or underfill) regardless of whether the silicon-based die(s) are mounted to a substrate by a flip-chip technique or by a non-flip chip technique (e.g. by wire bonding). In a flip-chip technique, a die can be connected to the package substrate (e.g., a laminate or printed circuit board substrate in some arrangements) by way of conductive interconnects between the die and the substrate, for example, pillars (e.g., copper pillars), solder bumps, etc. that are bonded to the substrate. To reduce the chance of damaging the interconnects and/or the flip-chip die(s), and/or to provide support to the package, an underfill material can be provided around the interconnects underneath the flip-chip die(s). In non-flip chip techniques, for example, wire bonding techniques, a silicon-based die (such as a switching die) can be wire bonded to the package substrate. For example, a silicon-based switching die can have bond pads (e.g., aluminum or copper bond pads in some embodiments) to which bonding wires may be connected. To reduce risk of oxidation of the bond pads, the encapsulating material may be provided over the switching die(s), the wire bonds, and unbonded portions of the bond pads. Silicon-based amplifiers can be similarly packaged with encapsulating material for more robust and protected connections.

FIG. 1 is a schematic diagram of one embodiment of a packaged module 100 for an RF communication system. Because the module 100 can contain multiple dies for processing (switching and amplifying) transmitted and received high frequency RF signals, particularly signals in the range of 1 GHz to 100 GHz, the module 100 may be referred to as a transmit/receive (TR) module. Advantageously, despite including dies of mixed technology, including both III-V and silicon-based dies, the module can be configured to accommodate differential packaging preferences for the different dies and enable the user to mount a single module on a system board.

Figure 5:
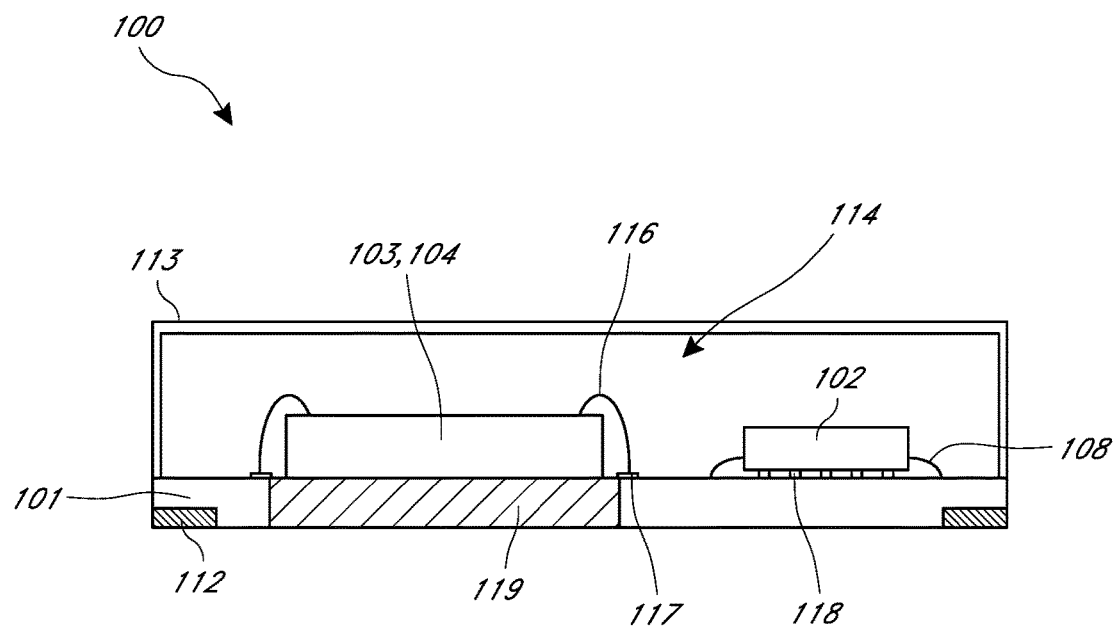
FIG. 5 is a cross sectional side view of the module in one embodiment that includes a flip-chip mounted die and a wire bonded die.
Figure 6:
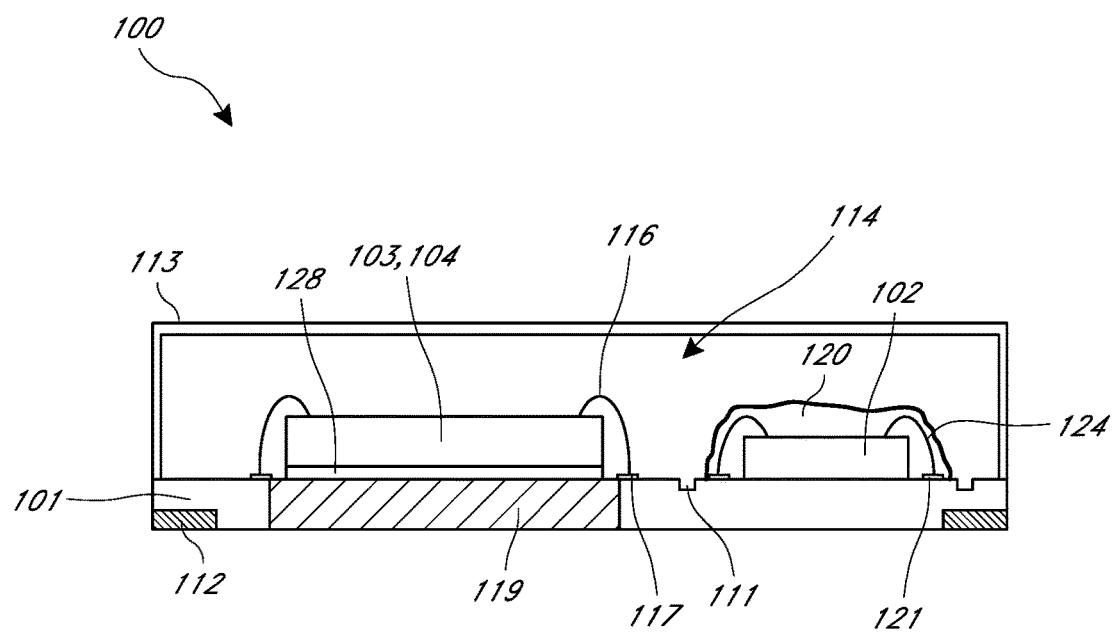
FIG. 6 is a cross sectional side view of the module in one embodiment that includes two wire bonded dies, one of which is provided with an encapsulating material and a dam.
Figure 7A:
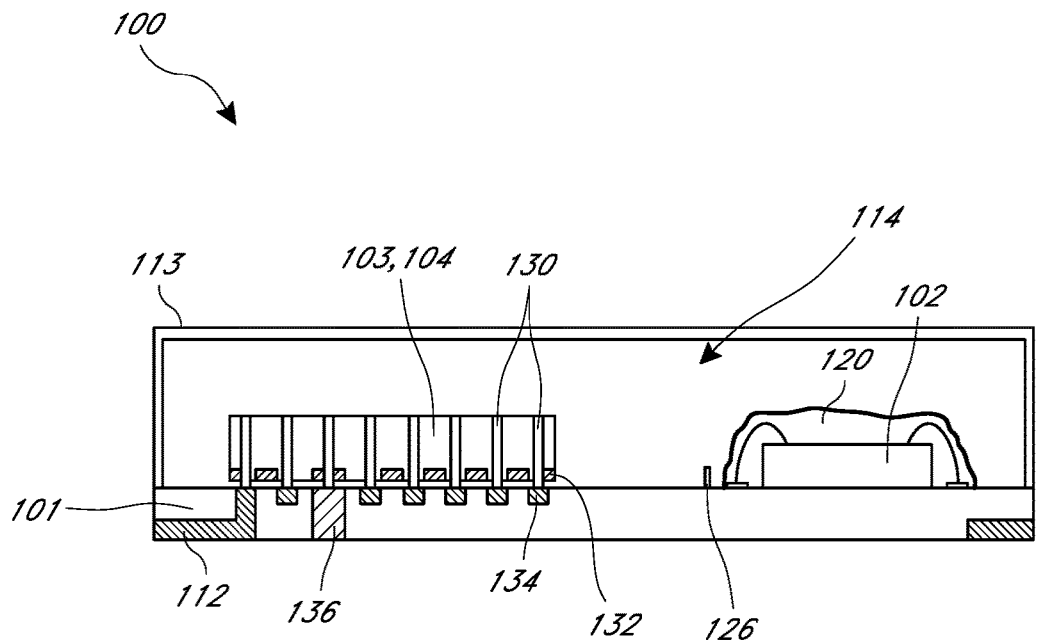
FIG. 7A is a cross sectional side view of the module in one embodiment that includes a wire bonded die and a die with through substrate RF vias.
Figure 8A:
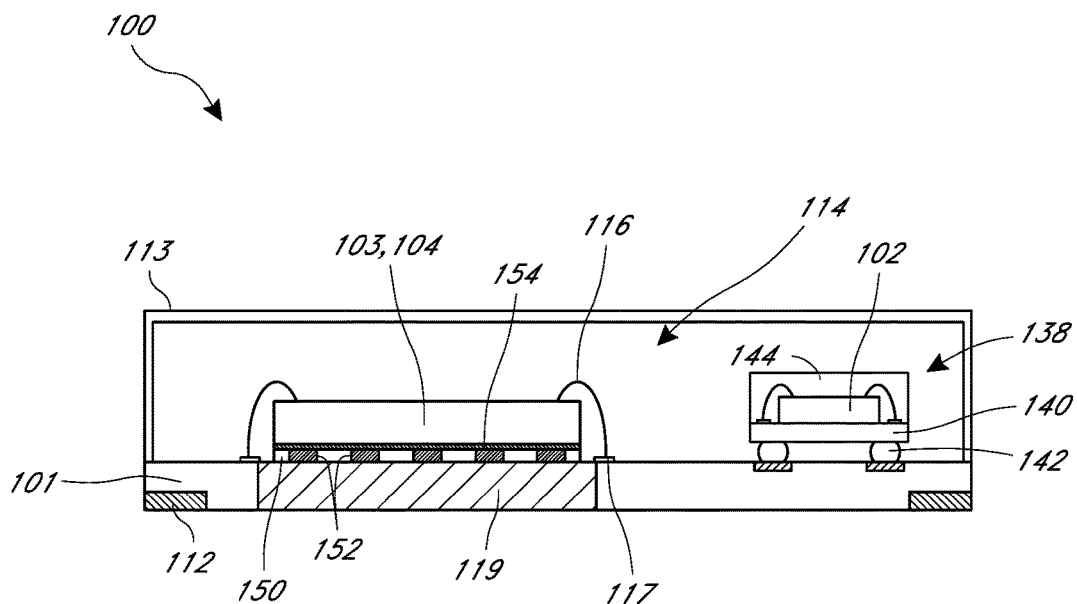
FIG. 8A is a cross sectional side view of the module in one embodiment that includes a separately packaged die and a wire bonded die.
Figure 9:
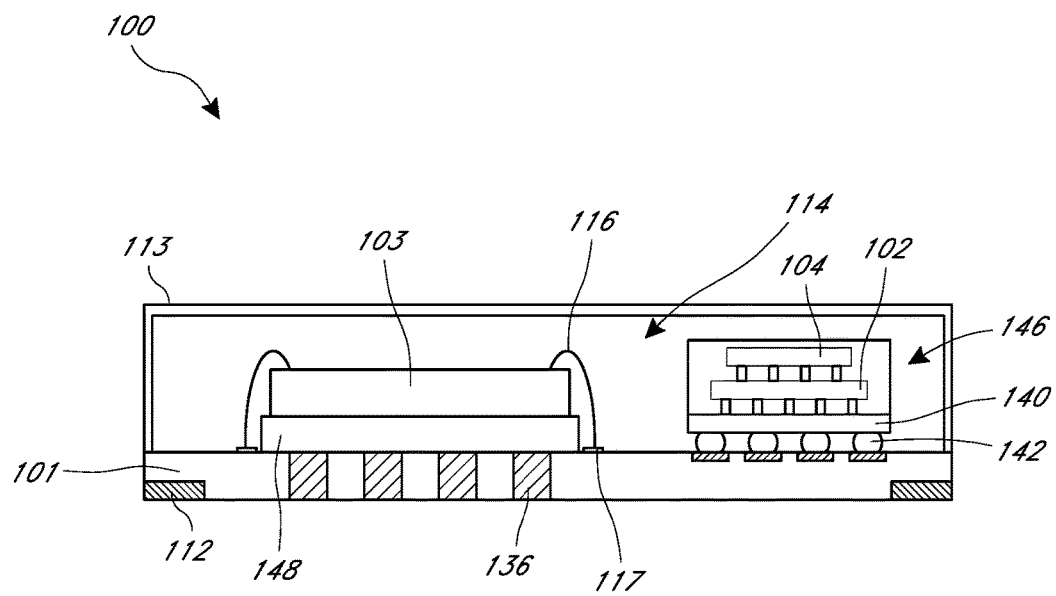
FIG. 9 is a cross sectional side view of the module in one embodiment that includes a multi-die package and a wire bonded die.

FIG. 1 is schematic and illustrates lateral locations of devices on an upper side of a package substrate 101 and leads 112 on a lower side of the package substrate 101. The module 100 includes the package substrate 101, a first die 102, a second die 103, a third die 104, a filter 105 (notch filter, in this example), and a directional coupler 106 on the upper side of the substrate 101. The package substrate 101 can comprise any suitable type of substrate for providing electrical and mechanical connections between dies and a system board. In some embodiments, the package substrate 101 may also enable formation of an air cavity in conjunction with a lid. Examples of the package substrate 101 include a laminate substrate (e.g., a printed circuit board or PCB, substrate), a molded leadframe substrate, a ceramic substrate, etc. The first die 102 comprises a silicon-based die and may comprise, for example, a switching die that includes radio frequency (RF) switching circuitry. The first die 102 may comprise a silicon on insulator (SOI) substrate. In some embodiments, the first die 102 may be flip-chip mounted on the package substrate 101, as shown in FIG. 5. In such embodiments, the first die 102 can be flipped over such that an active surface of the die 102 faces the package substrate 101, and interconnects (e.g., copper pillars, solder bumps, etc.) may be bonded or otherwise connected to corresponding lands of the package substrate 101. In some other embodiments, the first die 102 may be wire bonded to the package substrate 101, as shown in FIGS. 6 and 7A. In still other embodiments, the first die 102 can be separately packaged before mounting on the package substrate 101, as shown in FIGS. 8A and 9.

At least one of the second die 103 and the third die 104 comprises a compound semiconductor (e.g., Group III-V material) substrate such as, for example, GaN or GaAs. In some embodiments, each of the second and third dies 103, 104 comprise amplifier dies. For example, the second die 103 can include a power amplifier (PA) and the third die 104 can include a low noise amplifier (LNA), one or both of which can be formed in group III-V semiconductor substrates. In some embodiments, one of the second die 103 and the third die 104 may comprise a silicon substrate, such as an SOI substrate. In some embodiments, the first die 102 and the third die 104 comprise silicon-based dies and the second die 103 comprises the compound semiconductor substrate.

Using a silicon substrate for the first die 102 (e.g., the switching die) while using compound semiconductor substrates for one or both of the second and third dies 103, 104 (e.g., the PA and the LNA) can provide advantageous electrical behavior for their respective functions. For example, using compound semiconductor materials (e.g., GaN, GaAs, etc.) for one or both of the second and third amplifier dies 103, 104 can provide better amplification properties than silicon-based dies. By contrast, using an SOI substrate for the first switching die 102 can provide better switching properties than a compound semiconductor substrate.

In some embodiments, the filter 105 can be formed in or on the package substrate 101. In some embodiments, the filter 105 can comprise, for example, a strip line filter and/or a notch filter. The filter 105 can be configured to select which frequencies are transmitted from and/or received by the module 100. The directional coupler 106 can be configured to act as a power detector. The directional coupler 106 may sample or divert RF power from an RF signal path, allowing a detection circuit to convert the RF power to DC voltage, which can be simply measured to determine the amount of RF power is in the module. It may be beneficial to measure the RF power because, for example, it enables fault detections.

The module 100 may include encapsulating compound (e.g., a mold compound, an underfill, an encapsulant, an anti-oxidization gel, etc.) protecting electrical connections between the first die 102 and the package substrate 101. In some embodiments, where underfill is used for the first die 102 or any other flip-chip die, the substrate 101 may comprise a dam, moat or a trench (see FIGS. 3, 4, 6 and 7A) at least partially around the first die 102 to limit underfill bleeding (see FIG. 2). In some embodiments, the module 100 may include just sufficient space between the first die 102 and the second die 103 and/or the third die 104 on the substrate 101 to prevent the underfill from reaching the second and third dies 103, 104.

The module 100 as illustrated in FIG. 1 has a square shape having a first side, a second side opposite the first side, a third side perpendicular to the first and second side, and a fourth side opposite the third side. The module 100 can have any other suitable shape in other arrangements. A length of each of the first to fourth sides of the module 100 can be about 7 mm (e.g., in a range of 5.0 mm to 10.0 mm, more particularly 6.0 mm to 8.0 mm), providing a substrate surface area of about 49 mm$^2$ (e.g., in a range of 25 mm$^2$ to 100 mm$^2$, more particularly 36 mm$^2$ to 65 mm$^2$). However, skilled artisan would understand that, in some embodiments, the shape and/or the substrate surface area may be varied. Beneficially, the lateral footprint of the module 100 may be relatively small, while incorporating different types of RF dies and their associated functionality.

In some embodiments, packaging the first, second, and third dies 102, 103, 104 (e.g., a switch, a PA and an LNA) within the same packaged module can be beneficial. For example, such a co-packaging arrangement can provide enhanced front-end integration for a variety of applications such as, for example, a radar system. In some embodiments, one or more passive components 107a-107d (e.g., capacitors and/or resistors) may be surface mounted on the substrate 101. Accordingly, a radar system can be provided within a single package that can be readily mounted on a system board and simplify installation for vehicles. Accordingly, a user may mount the module 100 on a system board, occupying a relatively small footprint relative to individually mounted dies, in a single mounting operation, thus providing a system-in-package incorporating amplification and switching functionality for a transmit/receive (TR) module.

Figure 2:
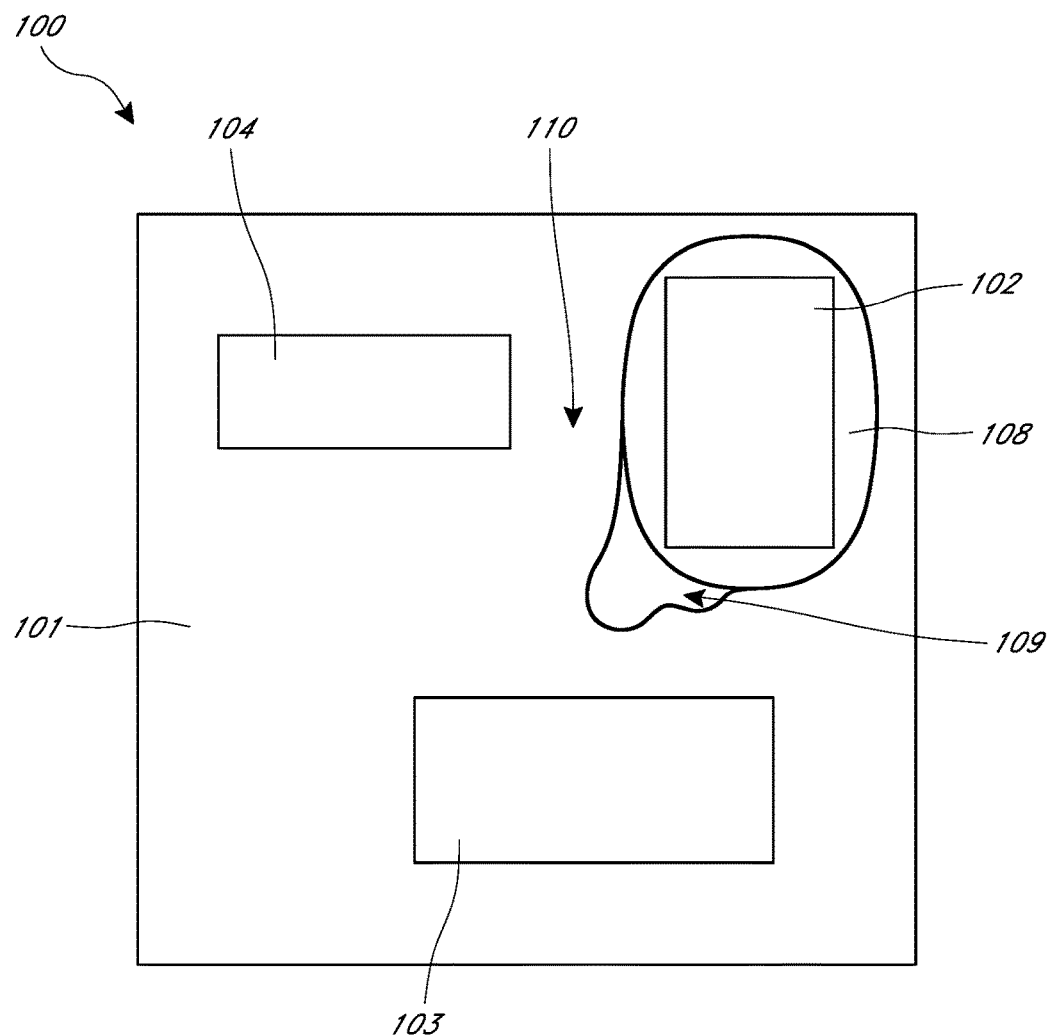
FIG. 2 is a schematic top plan view of the module of FIG. 1 in one embodiment that shows an underfill bleedout.

FIG. 2 is a schematic top plan view of the module 100 of FIG. 1 in one embodiment. The module 100 can comprise an RF module that includes a package substrate 101 (e.g., a laminate), a first die 102 (e.g., a switching die), a second die 103 (e.g., a PA die), and a third die 104 (e.g., an LNA die. The module 100 can also include a lid (not shown, see FIGS. 4-9) that is attached to the substrate 101. Unless otherwise noted, components of FIG. 2 are the same as or generally similar to like-numbered components shown in FIG. 1.

The module 100 includes encapsulating material (e.g., underfill 108) at least a portion between the substrate 101 and the first die 102 which is flip-chip bonded to the substrate 101. The underfill 108 can provide mechanical support for the first die 102 in addition to protecting the electrical connections from corrosion and ensuring electrical isolation.

As illustrated in FIG. 2, the encapsulating material (e.g., underfill 108) may result in bleedout 109, in some embodiments. As also illustrated in FIG. 2, an area or a space 110 can be provided on the substrate 101 between the first die 102 and the second and third dies 103, 104 that may prevent and/or mitigate the bleeding 109 from reaching the second and the third dies 103,104. Additionally or alternatively, the substrate 101 may have an encapsulant flow limiter, such as a dam, moat or trench (see FIGS. 3, 4, 6 and 7), to contain the bleedout 109.

Figure 3:
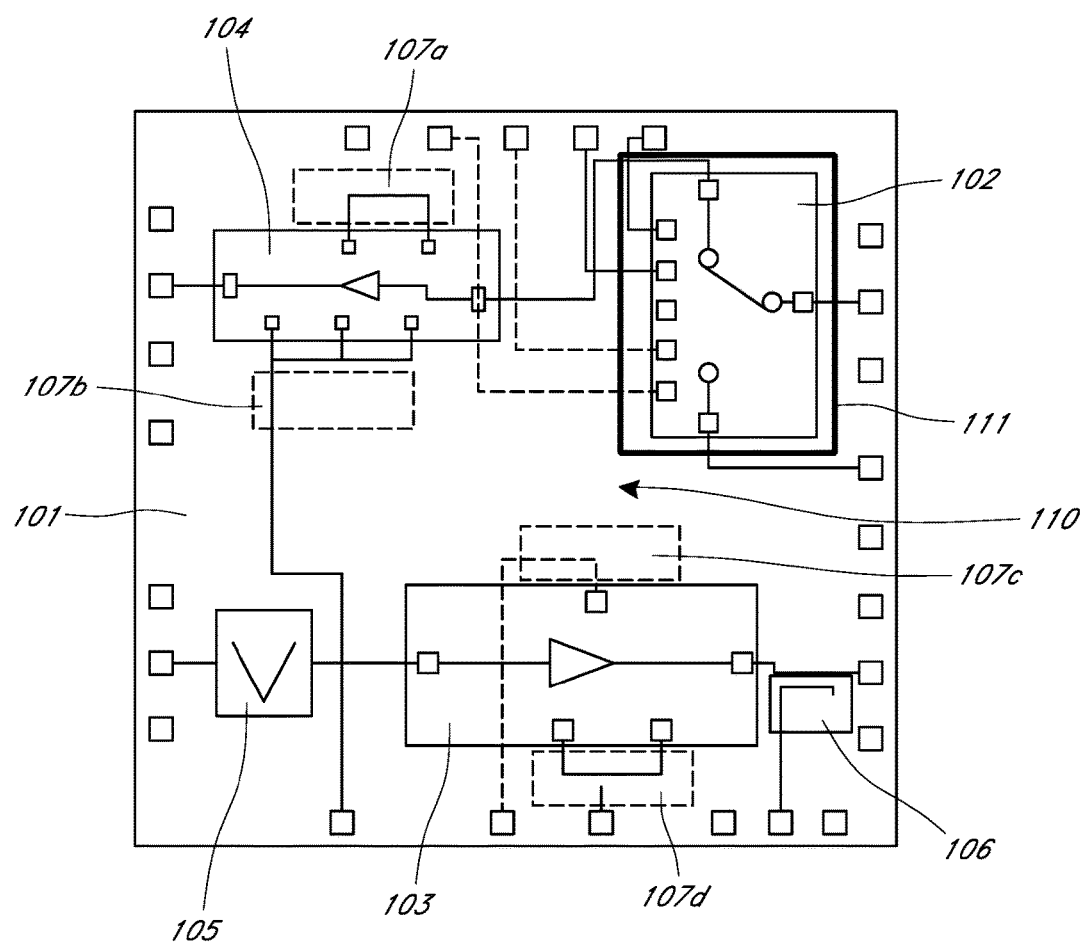
FIG. 3 shows a schematic diagram of the module for an RF communication system that includes an encapsulant flow limiter disposed around the first die.

FIG. 3 shows a schematic diagram of the module 100 for an RF communication system that includes an encapsulant flow limiter disposed around the first die 102. In the illustrated embodiment, the encapsulant flow limiter that comprises a moat 111 is a closed shape surrounding the first die 102. The moat 111 can define a trench or recess defined in the surface of the substrate 101 around the first die 102.

Figure 4:
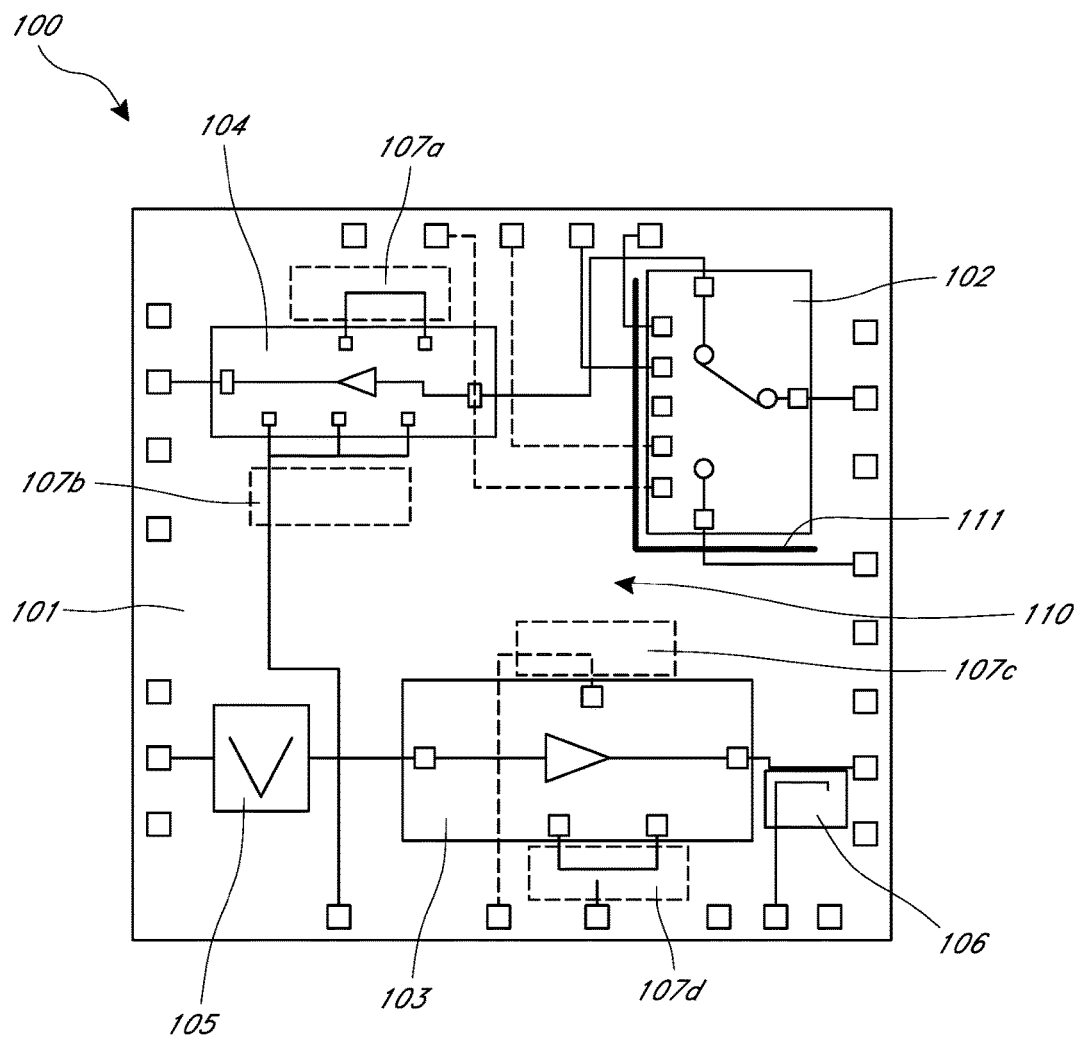
FIG. 4 shows a schematic diagram of the module for an RF communication system that includes an encapsulant flow limiter disposed partially around the first die.

FIG. 4 shows a schematic diagram of the module 100 for an RF communication system that includes an encapsulant flow limiter, in this case in the form of a moat 111, disposed only partially around the first die 102, between the first die 102 and the second and third dies 103, 104. FIGS. 3 and 4 are schematic and illustrate locations of the devices on the upper side of the substrate 101 and leads 112 on the lower side of the package substrate 101. Unless otherwise noted, components of FIGS. 3 and 4 are the same as or generally similar to like-numbered components shown in FIGS. 1-2. Beneficially, the moat 111 of FIGS. 3 and 4 can prevent and/or minimize the risk of the underfill 108 from reaching other components (particularly the second and third dies 103, 104) on the substrate 101.

In some embodiments, the first die 102 may be flip-chip mounted or wire bonded to the substrate 101. When the first die 102 is flip-chip mounted on the substrate 101, the underfill may be provided about the first die 102. When the first die 102 is wire bonded to the substrate 102, an overmold encapsulant or an anti-oxidization gel may be provided on bond pads of the first die 102 to prevent oxidation of the bond pads. In some embodiments, the module 100 with the moat 111 on the substrate 101 may have a space or the area 110 between the first die 102 and the second and third dies 103, 104 which may beneficially be smaller than the module 100 without the moat 111, such as the module 100 shown in FIGS. 1 and 2.

FIG. 5 is a cross sectional side view of the module 100 in one embodiment. The illustrated module 100 in FIG. 5 includes the first die 102 flip-chip mounted on the substrate 101, the second die 103 and/or the third die 104 wire bonded to contact pads 117 of the substrate 101 by wires 116, and a package lid 113 attached to the substrate 101. The contact pads 117 may be embedded in the substrate 101. Unless otherwise noted, components of FIG. 5 are the same as or generally similar to like-numbered components shown in FIGS. 1-4. In some embodiments, when the second die 103 and/or the third die 104 are electrically connected to the substrate 101 by way of wire bonding as shown in FIG. 5, the second and/or third die 103, 104 may be mechanically mounted to the substrate 101 by die attach epoxy. In some embodiments, when the first die 102 is flip-chip mounted on the package substrate 101 as in FIG. 5, the electrical connections between the first die 102 and the substrate can be protected by an encapsulating material. In some embodiments, underfill 108 may be disposed between the package substrate 101 and the flip-chipped first die 102, e.g., around the interconnects that connect the die 102 to the package substrate 101. No encapsulating material is provided on the second die and/or third die 103, 104, in some embodiments. Omitting the encapsulating material can reduce dielectric loss (e.g., lower loss tangent 6) for dies formed with III-V materials, such as amplifiers for RF signals. As illustrated in FIG. 5, the substrate 101 and the lid 113 can define an air cavity 114 such that the devices (e.g., the first die 102 and/or the third die 104) mounted on the substrate 101 can be disposed in the cavity 114. In such embodiments, electrical connections between the first die 102 and the substrate 101 can be protected and insulated with molding material, such as underfill 108, and the encapsulated first die 102 can be disposed in the cavity 114. The package lid 113 can be connected to the substrate 101, for example, by an adhesive.

In some embodiments, as in FIG. 5, a metal slug 119 (e.g., a solid piece of metal larger than a conventional via), such as, for example, a copper slug, can be integrated into the package substrate 101 beneath and preferably thermally contacting the second die 103 and/or the third die 104 (e.g., a PA die), thereby enhancing thermal performance. In some embodiments, the metal slug may be formed beneath and preferably contacting the second die 103, the third die 104 and/or any other devices mounted on the substrate 101. In some embodiments, the second die 103 may create more heat than the third die 104 during operation.

Though the metal slug 119 is explained with respect to FIG. 5 and show in FIGS. 5, 6 and 8A, in connection with the second or third die 103, 104 that is wire bonded to the substrate 101, a similar metal slug may be provided to the second or third die 103, 104 that is attached to the substrate 101 by TSVs as shown in FIG. 7A (with an air cavity) and 7B (without an air cavity), and/or to the first die 102 of various embodiments disclosed herein. The metal slug 119 may be used with package-in-package arrangements shown, for example, in FIGS. 8A and 9, or in any embodiments that includes any die that may produce heat.

FIG. 6 is a cross sectional side view of the module 100 in one embodiment. The illustrated module 100 in FIG. 6 includes the first die 102 wire bonded to contact pads 121 of the substrate 101 by wires 124, the second die 103 and/or the third die 104 wire bonded to contact pads 117 of the substrate 101 by wires 116, and a lid 113 attached to the substrate 101. The contact pads 117 and 121 may be embedded in the substrate 101. Unless otherwise noted, components of FIG. 6 are the same as or generally similar to like-numbered components shown in FIGS. 1-5. Unlike the embodiment of FIG. 5, the first die 102 illustrated in FIG. 6 is wire bonded to contact pads 121 of the substrate 101 by bond wires 124. In some embodiments, when the first die 102 is wire bonded to the package substrate 101 as in FIG. 6, the first die 102 can comprise bond pads for receiving bond wires 124. In some embodiments, when the first die comprises a silicon-based die, the bond pads for the first die 102 can comprise aluminum or copper. In such embodiments, an encapsulation material (e.g., an anti-oxidation gel 120) may be disposed over at least a portion of the first die 102 to protect the bond pads on the first die 102 from corrosion. Bond pads for silicon-based dies are often formed from aluminum. The encapsulating material may also protect the bond wires 124, as shown.

The package substrate 101 illustrated in FIG. 6 may include a moat 111 configured to limit the encroachment of the anti-oxidation gel 120 and/or any encapsulating material applied thereof. The module 100 may include a ground plane 128. In some embodiments, the second and/or third die 103, 104 may be connected to a ground plane 128, which may be a part of the second and/or third die 103, 104 and formed at the wafer level, and/or may be formed as part of the package substrate 101. In some embodiments, the ground plane 128 may be embedded in the package substrate 101. In some embodiments, the ground plane 128 may be patterned as shown as a ground plane 132 in FIG. 7A to permit signal lines to pass therethrough without shorting to ground.

FIG. 7A is a cross sectional side view of the module 100 in one embodiment. Unless otherwise noted, components of FIG. 7A are the same as or generally similar to like-numbered components shown in FIGS. 1-6. Unlike the embodiment of FIG. 6, the second and/or third die 103, 104 is bonded to the package substrate 101 without bond wires. For example, the second and/or third dies 103, 104 can be mounted with the active side facing up (open to the air cavity 114) and can be electrically and mechanically connected to the package substrate 101, such as using solder or anisotropic conductive film, by way of through substrate vias (TSVs) 130 configured for carrying high frequency RF signals from the active side (e.g., a top surface) of the die(s) 103, 104 to the backside (e.g., a bottom surface) of the die(s) 103, 104. The TSVs 130 that carry high frequency RF signals may also be referred to as RF vias. The TSVs 130 may comprise cylindrical holes with conductive material at least lining, and in some embodiments filling, a through-substrate hole. The vias may be formed by, for example, a monolithic microwave integrated circuit (MMIC) fabrication process. The TSVs 130 are configured to carry RF signal connections and one or more ground connections configured to be electrically connected to corresponding pads 134 on the package substrate 101. Such embodiments can be beneficial in reducing the horizontal dimensions of the module 100 compared to embodiments with wire bonds. Attaching a die using the TSVs may also provide a better thermal performance than flip-chip mounting the die. FIG. 7A also illustrates a ground plane 132 on the bottom of the second and/or third die 103, 104, where the ground plane 132 is patterned to allow signal line TSVs 130 to pass through the ground plane, whereas ground TSVs 130 may contact the ground plane 132.

By obviating wire bonds, the use of RF vias in the form of TSVs 130, the embodiment of FIG. 7A advantageously enables even smaller packages for the mixed technology module, which may serve as a transmit/receive module. For example, the substrate surface area of the module 100 of FIG. 7A may occupy between about 12 mm$^2$ and 65 mm$^2$, more particularly between about 15 mm$^2$ and 50 mm$^2$, while still providing the performance demanded of high frequency RF communication modules.

Though the ground plane 128 and the ground plane 132 are shown in FIG. 6 in connection with the second or third die 103, 104 that is wire bonded to the substrate 101 and in FIG. 7A in connection with the second or third die 103, 104 that is bonded via the RF vias, a similar ground plane may be provided to the first die 102 of various embodiments disclosed herein. In some embodiments, the ground plane 128 and the ground plane 132 may be applied to embodiments without the air cavity, such as the embodiment shown in FIG. 7B. The ground plane 128 and the ground plane 132 may be applied to package-in-package arrangements shown, for example, in FIGS. 8A and 9, or in any embodiments that attaches any die to the substrate 101. As noted above, the ground plane may be formed as part of the dies and/or the package substrates in various embodiments, and may be patterned to allow signal lines to pass therethrough without shorting.

As illustrated with respect to the embodiment below of FIGS. 8A and 8B, in some embodiments, the module 100 may have one or more solder mask webs on the upper side of the package substrate 101. For example, the package substrate 101 can comprise a plurality of pads that are spaced at least in part by the one or more solder masks. In some embodiments, the solder mask webs may create an uneven surface on the upper side of the package substrate 101 such that a surface area of the upper side is made larger than the upper side without the solder mask webs. In some embodiments, the solder mask webbed structure can enhance the adhesion between one or more of the dies and the package substrate 101 by way of intervening die attach materials (such as epoxy), preventing and/or mitigating delamination of the die(s).

The package substrate 101 illustrated in FIG. 7A also includes a dam 126 configured to limit flow of the anti-oxidation gel 120 and/or any encapsulating material applied thereof from reaching the other components on the package substrate 101. In some embodiments, the package substrate 101 can have a through laminate vias 136 for providing heat and/or ground connections. In some embodiments, the through-laminate vias 136 may each comprise a hole with metal disposed on a cylindrical wall. In some embodiments, the hole may be lined with metal. In other embodiments, the hole may be filled with metal. In some embodiments, the through-laminate vias 136 are configured to act both a thermal conduit and a ground connection. In other embodiments, such the through-laminate vias 136 can serve as both a thermal conduit and a signal connection. It should be understood that the through-laminate vias 136 may be disposed at any location in the package substrate 101 with any embodiments disclosed herein.

Figure 7B:
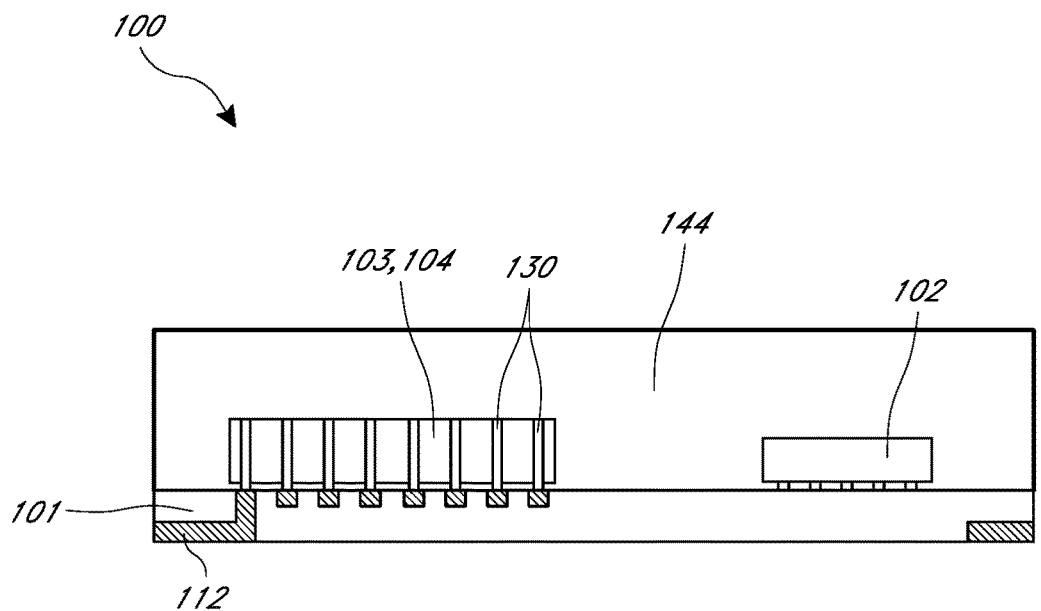
FIG. 7B is a cross sectional side view of the module in one embodiment that includes two encapsulated dies.

FIG. 7B is a cross sectional side view of the module 100 in one embodiment. Unless otherwise noted, components of FIG. 7B are the same as or generally similar to like-numbered components shown in FIGS. 1-7A. The module 100 includes the first die 102 that is flip-chip mounted to the substrate 101 and the second and/or third die 103, 104 mounted to the substrate 101 by TSVs. The first die 102 and the second and/or third die 103, 104 are embedded in an encapsulation compound 144. In the illustrated embodiment, a single encapsulation compound 144 commonly encapsulates both a compound semiconductor die (such as the second and/or third die 103, 104) and a silicon-based die (such as the first die 102). The encapsulant 144 may be may be applied to a common laminate substrate prior to singulation of modules from one another, resulting in flush side edges from the package substrate 101 and the encapsulant 144. In other embodiments, the first die 102 and the second and/or third die 103, 104 may be separately encapsulated, in which case the different encapsulation portions may comprise different material suitable for encapsulating the die.

The encapsulation compound 144 can provide a mechanical protection. Such protection may provide reliability benefits. With improvements in the compound semiconductor technologies, negative effects of having the encapsulation compound 144 over Group III-V material dies may be minimized. With such improvement, users may choose to have the encapsulation compound 144 for its benefits despite its negative effects.

Like FIG. 7A, the embodiment of FIG. 7B benefits from use of RF vias in the form of TSVs 130, which allow strong thermal performance while handling RF frequency signals therethrough, and which is further improved by use of through-laminate vias 136. Use of molded encapsulant enables even further reduction on occupied footprint of the module 100, relative to modules employing wire bonding.

FIG. 8A is a cross sectional side view of the module 100 comprising a package-in-package in one embodiment. The module 100 includes an integrated circuit (IC) package 138 attached to the package substrate 101 by solder balls 142, the second and/or third die 103, 104 wire bonded to contact pads 117 of the package substrate 101 by wires 116, and a lid 113 attached to the package substrate 101. The second and/or third die 103, 104 is mechanically attached to the substrate 101 by an adhesive (e.g., die attach epoxy 154). Unless otherwise noted, components of FIG. 8A are the same as or generally similar to like-numbered components shown in FIGS. 1-7B. The package 138 is illustrated with the first die 102 wire bonded to a package carrier 140 (e.g., lead frame, laminate substrate, etc). In some embodiments, the first die 102 may be packaged separately from the module 100 prior to mounting on the package substrate 101. For example, the first die 102 can be encapsulated, e.g., overmolded, in an encapsulation compound 144, and leads (e.g., solder balls 142 and/or lead frame leads) can be provided in the package carrier 140 for electrically and mechanically connecting the package 138 to the package substrate 101. While the first die 102 is illustrated as separately packaged, the skilled artisan will appreciate that other dies can additionally or alternatively be packaged for mounting on the package substrate 101. The die(s) within the IC package 138 including encapsulation can be silicon-based dies, whereas die(s) exposed to the air cavity 114 can be Group III-V material dies.

In one embodiment, the first die 102 encapsulated within the IC package 138 is a silicon-based die that includes both LNA circuits and RF switch circuits. In such an embodiment, the second die 103 is mounted with its active surface exposed to the air cavity, and the first die 102 provides both LNA and RF switch functions for the TR module 100, such that a separate LNA die and separate packaging therefore can be omitted. Omitting the separate LNA die may allow for designing the module with smaller lateral footprint than that with the separate LNA die. The skilled artisan will appreciate that, similarly, the first die 102 for each of FIGS. 5-7 can be a silicon-based (e.g., SOI) die including LNA and RF switch circuitry, and a separate third die 104 can be omitted.

Figure 8B:
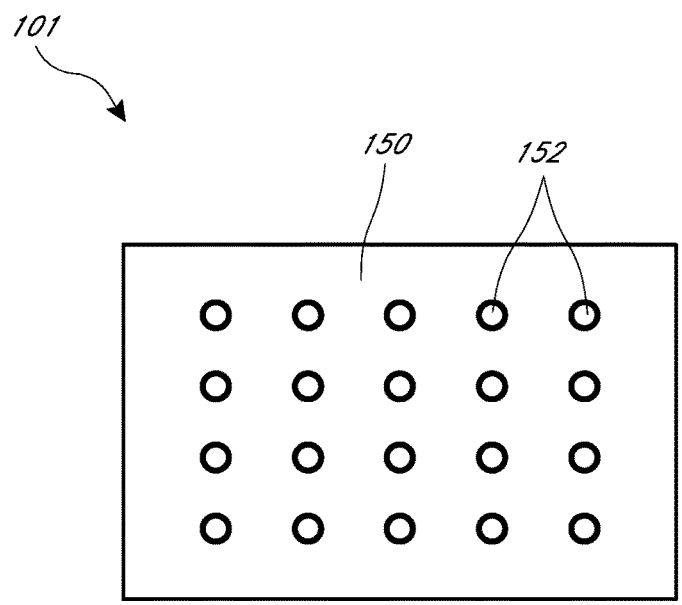
FIG. 8B is a top down plan view of a portion of a substrate of FIG. 8A that the wire bonded die is mounted, prior to mounting the die.

FIG. 8B is a top down plan view of a portion of the substrate 101 of FIG. 8A that the second and/or third die 103, 104 is mounted, prior to mounting the second or third die 103, 104. The portion of the substrate 101 can include a solder mask 150. When attaching the second and/or third die 103, 104 to the substrate 101, an adhesive (e.g., a die attach epoxy 154) may be applied between a bottom surface of the second and/or third die 103, 104 and the substrate 101. In some embodiments, the die attach epoxy 154 has better adhesion with the solder mask 150 than with the metal slug 119 or the ground plane 128 (see, for example, FIG. 6) formed on the substrate 101. Therefore, the solder mask may reduce the chance of delamination of the die 103, 105 from the substrate 101. In some embodiments, the solder mask 150 may have a webbed structure. In some embodiments, the solder mask 150 may include a plurality of holes 152 that form the webbed structure. Such embodiments may provide increased surface area for better adhesion between the die attach epoxy 154 and the solder mask 150. In some embodiments, the solder mask webs may create an uneven surface on the upper side of the package substrate 101 such that a surface area of the upper side is made larger than the upper side without the solder mask webs. In some embodiments, the holes 152 may completely go through the solder mask 150 as shown in FIG. 8B. In other embodiments, the holes 152 may be blind holes.

Though the solder mask 150 is shown in FIG. 8A in connection with the second or third die 103, 104 that is wire bonded to the substrate 101, a similar solder mask web may be provided to the second or third die 103, 104 that is attached to the substrate 101 by TSVs as shown in FIG. 7A (with an air cavity) and 7B (without an air cavity), and/or to the first die 102 of various embodiments disclosed herein. The solder mask structure may be applied to package-in-package arrangements shown, for example, in FIGS. 8A and 9, or in any embodiments that attaches any die to the substrate 101. In some embodiments, the package substrate 101 can comprise a plurality of pads that are spaced at least in part by the one or more solder masks that form the webbed structure.

FIG. 9 is a cross sectional side view of the module 100 comprising a package-in-package in another embodiment. The module 100 includes an integrated circuit (IC) package 146 attached to the package substrate 101 by solder balls 142, the second die 103 wire bonded to contact pads 117 of the package substrate 101 by wires 116, and a lid 113 attached to the package substrate 101. Unless otherwise noted, components of FIG. 9 are the same as or generally similar to like-numbered components shown in FIGS. 1-8B. The IC package 146 can comprise the first die 102 and the third die 104. As illustrated in FIG. 9, the third die 104 may be stacked on top of the first die 102. For example, the dies 102, 104 may be packaged together separately from the module 100 and the IC package 146 can be mounted on the package substrate 101. The die(s) within the IC package 146 including encapsulation can be silicon-based dies, whereas die(s) exposed to the air cavity 114 can be Group III-V material dies. In some embodiments, having the first die and the third die 102, 104 in the IC package 146 may reduce the lateral footprint of the module 100.

The module 100 may include a die pad 148 that can serve as a ground and/or thermal connection between the package substrate 101 and the second die 103 that is attached to the substrate by wires 116. The module 100 may include array of through laminate vias 136 beneath the layer 148 for providing heat and/or ground connections.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. For example, the dams, moats, heat slugs, through-substrate vias and through-laminate vias of some illustrated embodiments can be exchanged for corresponding features in other illustrated embodiments. Thus, it is intended that the scope of the present invention herein disclosed should not be limited by the particular disclosed embodiments described above, but should be determined only by a fair reading of the claims that follow.

What is claimed is:

1. A packaged radio frequency (RF) module comprising:
   a package substrate;
   a first die electrically and mechanically attached to the package substrate, the first die comprising an RF switch;
   a second die electrically and mechanically attached to the package substrate, the second die comprising an RF amplifier;
   an encapsulating material protecting electrical connections between the first die and the package substrate; and
   a lid attached to the package substrate such that the package substrate and the lid at least partially define an air cavity within which the first and the second die are mounted, an active surface of the second die being exposed to the air cavity.

2. The packaged RF module of claim 1, wherein the first die is flip-chip attached to the package substrate by way of a plurality of interconnects between the first die and the package substrate, and the encapsulating material comprises underfill disposed at least partially between the first die and the package substrate.

3. The packaged RF module of claim 1, further comprising an encapsulant flow limiter on the package substrate at least partially around the first die and configured to capture encapsulating material bleeding from the first die.

4. The packaged RF module of claim 1, wherein the second die is connected to the package substrate by RF vias.

5. The packaged RF module of claim 4, wherein the second die comprises a bottom surface opposite the active surface, the bottom surface comprises patterned contacts for RF signal connections between the second die and the package substrate.

6. The packaged RF module of claim 1, wherein the substrate comprises one or more solder webs on the package substrate.

7. The packaged RF module of claim 1, wherein the first die is wire bonded to the package substrate, wherein the encapsulating material comprises a gel at least over bond wired connections on the first die.

8. The packaged RF module of claim 1, wherein the first die packaged within the encapsulating material and mounted onto the package substrate, and the encapsulating material comprises an overmold encapsulant.

9. The packaged RF module of claim 1, further comprising a filter integrated with the package substrate.

10. The packaged RF module of claim 1, further comprising at least one of a metal slug and a through substrate via (TSV) integrated into the package substrate beneath the second die.

11. The packaged RF module of claim 1, further comprising a third die attached to the package substrate and comprising a second RF amplifier, wherein the second die comprises a power amplifier (PA) and the third die comprises a low noise amplifier (LNA).

12. The packaged RF module of claim 11, wherein an active surface of the third die is exposed to the air cavity.

13. The packaged RF module of claim 11, wherein the first die and the third die are packaged to define an integrated circuit (IC), the IC is attached to the package substrate by solder balls.

14. The packaged RV module of claim 1, Wherein the second die comprises a compound semiconductor substrate and the first die comprises a silicon-on-insulator (SOI) die.

15. A transmit/receive (TR) module comprising:
   a package substrate;
   at least one compound semiconductor die electrically and mechanically attached to the package substrate;
   at least one silicon-based die electrically and mechanically attached to the package substrate;
   an encapsulating material protecting electrical connections between the silicon-based die and the package substrate; and
   a lid attached to the package substrate such that the package substrate and the lid at least partially define an air cavity within Which the silicon-based and the compound semiconductor die are mounted, an active surface of the compound semiconductor die being exposed to the air cavity.

16. The TR module of claim 15, wherein the compound semiconductor die comprises a Group III-V semiconductor substrate, and the compound semiconductor die comprises an amplifier die.

17. The TR module of claim 16, further comprising a separate carrier substrate between the silicon-based die and the package substrate in a package-in-package arrangement, wherein the amplifier die comprises a power amplifier and the silicon-based die comprises an RF switch die.

18. The TR module of claim 15, further comprising a separate carrier substrate between the silicon-based die and the package substrate in a package-in-package arrangement, wherein the at least one silicon-based die comprises a low noise amplifier circuit and an RF switch circuit.

19. A packaged radio frequency (RF) module comprising:
   a package substrate;
   a compound semiconductor die mechanically attached to the package substrate, the compound semiconductor die electrically connected to the package substrate by way of through substrate vias (TSVs) configured to carry RF signals from an active side of the compound semiconductor die to a back side of the compound semiconductor die;
   a silicon based die electrically and mechanically attached to the package substrate; and
   an encapsulating material covering electrical connections of the silicon based die.

20. The package RF module of claim 19, wherein the compound semiconductor die is additionally encapsulated.

21. The packaged RF module of claim 10, wherein the at least one of the metal slug and the TSV is coupled to a back side of the second die opposite the active side so as to provide a ground connection to the second die.

* * * * *